United States Patent [19]
Bae

[11] Patent Number: 5,663,970
[45] Date of Patent: Sep. 2, 1997

[54] CIRCUIT AND METHOD FOR TESTING FREQUENCIES

[75] Inventor: Jeong Hwan Bae, Kyeungki-do, Rep. of Korea

[73] Assignee: LG Semicon Co., Ltd., Cheongju, Rep. of Korea

[21] Appl. No.: 496,120

[22] Filed: Jun. 27, 1995

[30] Foreign Application Priority Data

Jun. 27, 1994 [KR] Rep. of Korea ............... 1994-14884

[51] Int. Cl.⁶ .......................... G01R 23/00; H03D 13/00
[52] U.S. Cl. .......................... 371/61; 371/70; 324/76.41; 324/76.48
[58] Field of Search .......................... 371/61, 62, 57.1; 364/270; 328/155; 324/76.41, 76.39, 76.48; 377/20; 327/160, 43, 145

[56] References Cited

U.S. PATENT DOCUMENTS

| | | | |
|---|---|---|---|
| 5,150,068 | 9/1992 | Kawashima et al. | 328/155 |
| 5,199,008 | 3/1993 | Lockhart et al. | 368/117 |
| 5,245,311 | 9/1993 | Honma | 340/146.2 |
| 5,442,278 | 8/1995 | Fan Chiang et al. | 324/76.41 |
| 5,475,324 | 12/1995 | Tomiyori | 327/145 |
| 5,479,420 | 12/1995 | Hong et al. | 371/61 |
| 5,488,645 | 1/1996 | Mori et al. | 377/20 |

*Primary Examiner*—Robert W. Beausoliel, Jr.
*Assistant Examiner*—Nadeem Iqbal
*Attorney, Agent, or Firm*—Alan R. Loudermilk

[57] ABSTRACT

A method and apparatus are provided for testing whether an electronic circuit, or DUT, for generating a clock signal is generating a signal of a frequency within a regulated frequency range. The method includes the steps of: supplying a driving clock or signal to cause the circuit to be tested to generate test clock signals as designed; causing a clock generator to generate an upper limit frequency clock signal and a lower limit frequency clock signal based on the clock signal of the circuit; simultaneously counting the testing clock signal of the circuit, the upper limit frequency clock signal and the lower limit frequency clock signal of the clock generator, and generating resultant signals upon the count reaching certain numbers; and issuing a pass signal when a count result of the upper limit frequency clock signals is output first, and a count result of the testing clock signal of the circuit is output next, and otherwise issuing a fail signal.

20 Claims, 4 Drawing Sheets

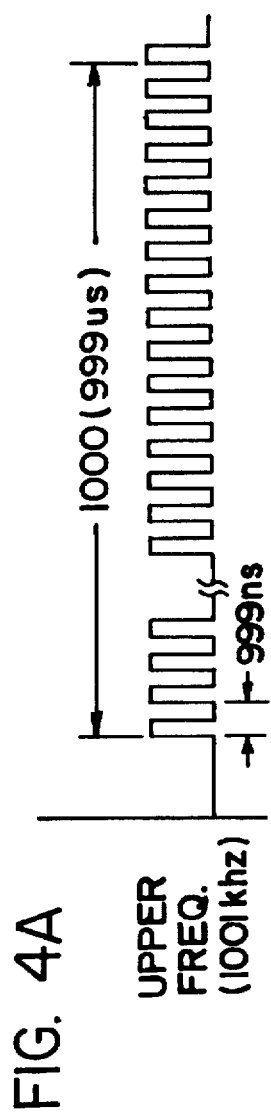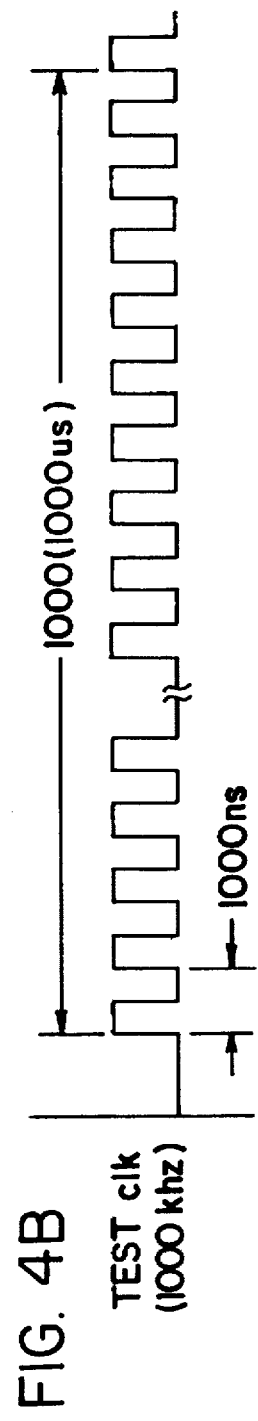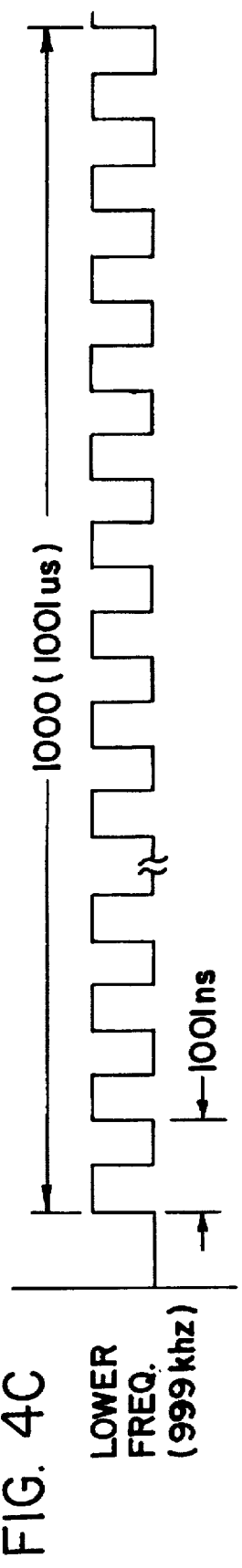
FIG. 4A  UPPER FREQ. (1001 khz)
FIG. 4B  TEST clk (1000 khz)
FIG. 4C  LOWER FREQ. (999 khz)

CIRCUIT AND METHOD FOR TESTING FREQUENCIES

FIELD OF THE INVENTION

The present invention relates to techniques for testing whether clock signals are generated within a predetermined frequency range, and more particularly to circuits for testing high frequency signals using a simple test circuit.

BACKGROUND OF THE INVENTION

FIG. 1 is a block diagram illustrating a general frequency measuring apparatus. As illustrated in FIG. 1, this circuit includes: test control section 1 for overall control and driving of various sections of the system, for outputting logic comparison patterns, and for defining the frequency of the device to be tested, DUT 3, based on a logic comparison pattern; clock generator 2 for generating reference clocks and clocks MCLK to be input into DUT 3 to be tested in accordance with the logic comparison pattern of test control section 1; counter 4 for counting the reference clocks; and latch 5 for holding the output of counter 4. The operation of this circuit will be described referring to FIG. 2.

For example, as illustrated in FIG. 2, a test will be described for a signal having a duty ratio of 50% and a frequency of 1 MHz (the period of the cycle being 1000 nano seconds), and which is output from DUT 3.

If a signal is tested by generating a timing signal having a period of 10 nano seconds, i.e., such as with a clock signal of 10 MHz used as a reference signal, the error is 10% or more. Therefore, if an error of about 1% is to be maintained, timing signal generator 2 is required to generate a timing signal of less than 10 nano seconds, i.e., a clock signal of a frequency such as 100 MHz.

In the case where a timing signal of 10 nano seconds, i.e., a clock of 100 MHz, is to be used, test control section 1 generates a control signal through its control logic which is supplied to clock generator 2, and clock generator 2 generates a clock with a period of 10 nano seconds. That is, a control signal is sent to clock generator 2, so that there would be generated a clock of 10 nano seconds for testing the low period from point A to point B, and for testing the high period from point B to point C. In accordance with this control signal, clock generator 2 generates a clock and a reference clock and sends them to counter 4, while clock MCLK is sent to DUT 3.

The counted output value of counter 4 is held by latch 5, while test control section 1 reads the data from latch 5. Thus, the generated frequency of DUT 3 is computed, and a pass or fail determination is made.

Under this condition, during the time when test clock signal TEST CLK moves from point A to point B, clock generator 2 outputs continuously reference clocks with a period of 10 nano seconds. At the moment when a 51st clock is output, the output of counter 4 changes and is held by latch 5. Based on this, the number of reference clocks up to point B can be determined.

During the time when the test clock signals vary from point B to point C, the reference clock pulses are counted in the same manner. During this operation, test control section 1 carries out the following arithmetic operation, thereby recognizing the frequency of test clock signal TEST CLK.

| | |
|---|---|
| Low period of TEST CLK | = No. of reference clocks output between points A and B × 10 ns |
| | = 50 × 10 ns |
| | = 500 ns |
| High period of TEST CLK | = No. of reference clocks output between points B and C |
| | = 50 × 10 ns |
| | = 500 ns |
| Frequency $F_1$ of measured test CLK: | 1 cycle/(500 ns + 500 ns) |
| | = 1 MHz |

The 1 MHz frequency thus measured is subjected to a decision as to whether it belongs to a particular frequency range or not, thereby testing the frequency of the test clock signals.

However, in such a general frequency measuring circuit, as the frequency of the test clock signal is high, the clock generator has to generate high frequency reference clocks, and a higher cost has to be incurred. Further, a decision procedure as to whether the clock signals to be tested belong to a particular frequency range is required. Therefore, the frequency measuring time is extended.

SUMMARY OF THE INVENTION

The present invention is intended to overcome the above-described disadvantages of the conventional technique. Therefore, it is an object of the present invention to provide a circuit for testing frequencies, which is capable of accurately checking whether rectangular clock signals are being generated within a particular frequency range, without requiring a high resolution timing generator or pattern generator.

According to the present invention, a circuit for testing whether an electronic circuit to be tested or DUT generates signals of a predetermined frequency range, includes: a clock generator for generating upper limit frequency clock signals and lower limit frequency clock signals based on clock signals of the DUT, and for generating driving clocks/signals MCLK to cause the DUT to generate clock signals as designed, a first transmitting circuit for transmitting or blocking the upper limit frequency clock signals of the clock generator, a second transmitting circuit for transmitting or blocking the test clock signals of the circuit DUT, a third transmitting circuit for transmitting or blocking the lower limit frequency clock signals of the clock generator, a first racing circuit connected to the first transmitting circuit for counting incoming clocks when reset signals are enabled and for varying an output voltage state upon reaching a certain number of clocks, a second racing circuit connected to the second transmitting circuit for counting incoming clock signals when reset signals are enabled and for varying an output voltage state upon reaching a certain number of clock signals, an output of the second racing circuit being supplied to the first, second and third transmitting circuits as control signals thereof, a third racing circuit connected to the third transmitting circuit for counting incoming clock signals when reset signals are enabled and for varying an output voltage state upon reaching a certain number of clock signals, and a deciding circuit with its input connected to output terminals of the first, second and third racing circuits for outputting a pass signal only when an output of the first racing circuit first changes, and then an output of the second racing circuit changes.

A method in accordance with the present invention includes the steps of supplying driving clocks/signals MCLK to cause a circuit to be tested DUT to generate test clock signals as designed, causing a clock generator to generate upper limit frequency clock signals and lower limit frequency clock signals based on the clock signals of the DUT, simultaneously counting the testing clock signals of the DUT and the upper limit frequency clock signals and the lower limit frequency clock signals of the clock generator, and generating resultant signals upon counting certain numbers, and issuing a pass signal only when a counted result of the upper limit frequency clock signals is first output, and a counted result of the testing clock signals of the DUT is output next, and issuing a fail signal otherwise.

BRIEF DESCRIPTION OF THE DRAWINGS

The above objects and other advantages of the present invention will become more apparent by describing in detail the preferred embodiments of the present invention with reference to the attached drawings in which:

FIG. 4 illustrates wave patterns of the test clock signals of the clock generator of FIG. 3.

DESCRIPTION OF THE PREFERRED EMBODIMENTS

Figure 1:
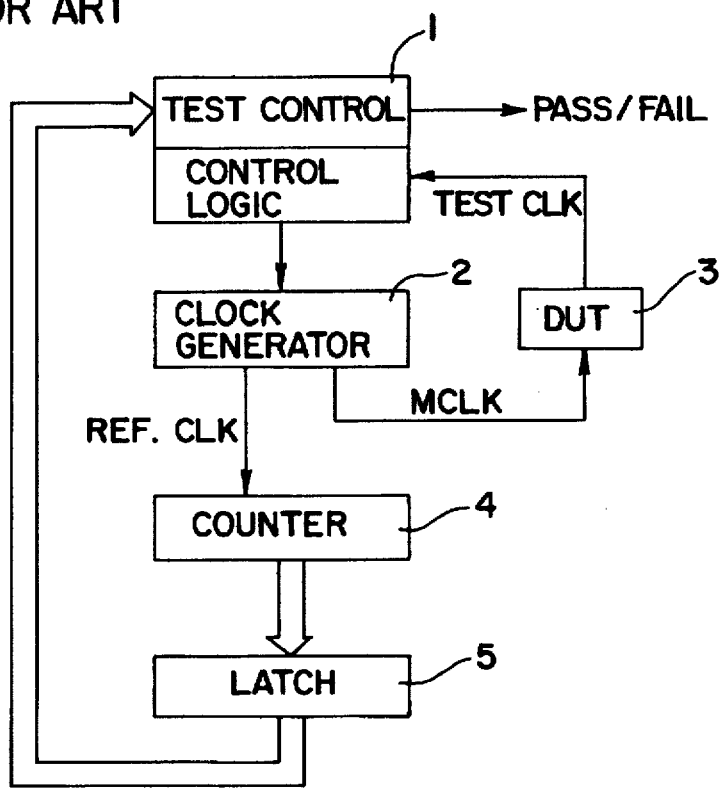
FIG. 1 is a block diagram illustrating the constitution of a general frequency measuring circuit.
Figure 2:
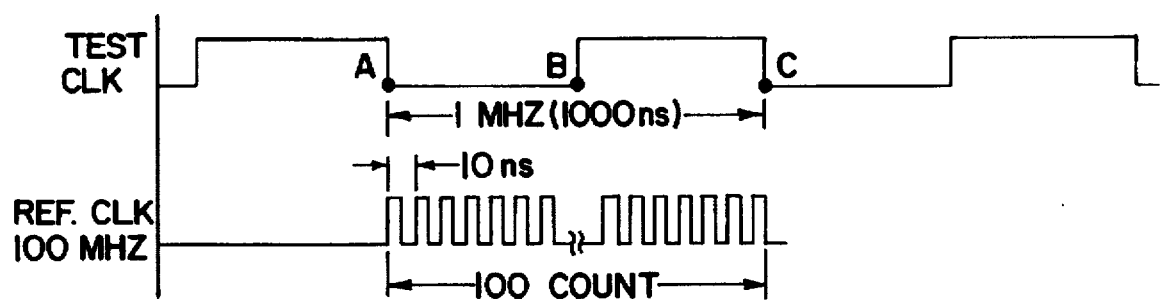
FIG. 2 illustrates wave patterns of the test clock signals of the clock generator of FIG. 1.
Figure 3:
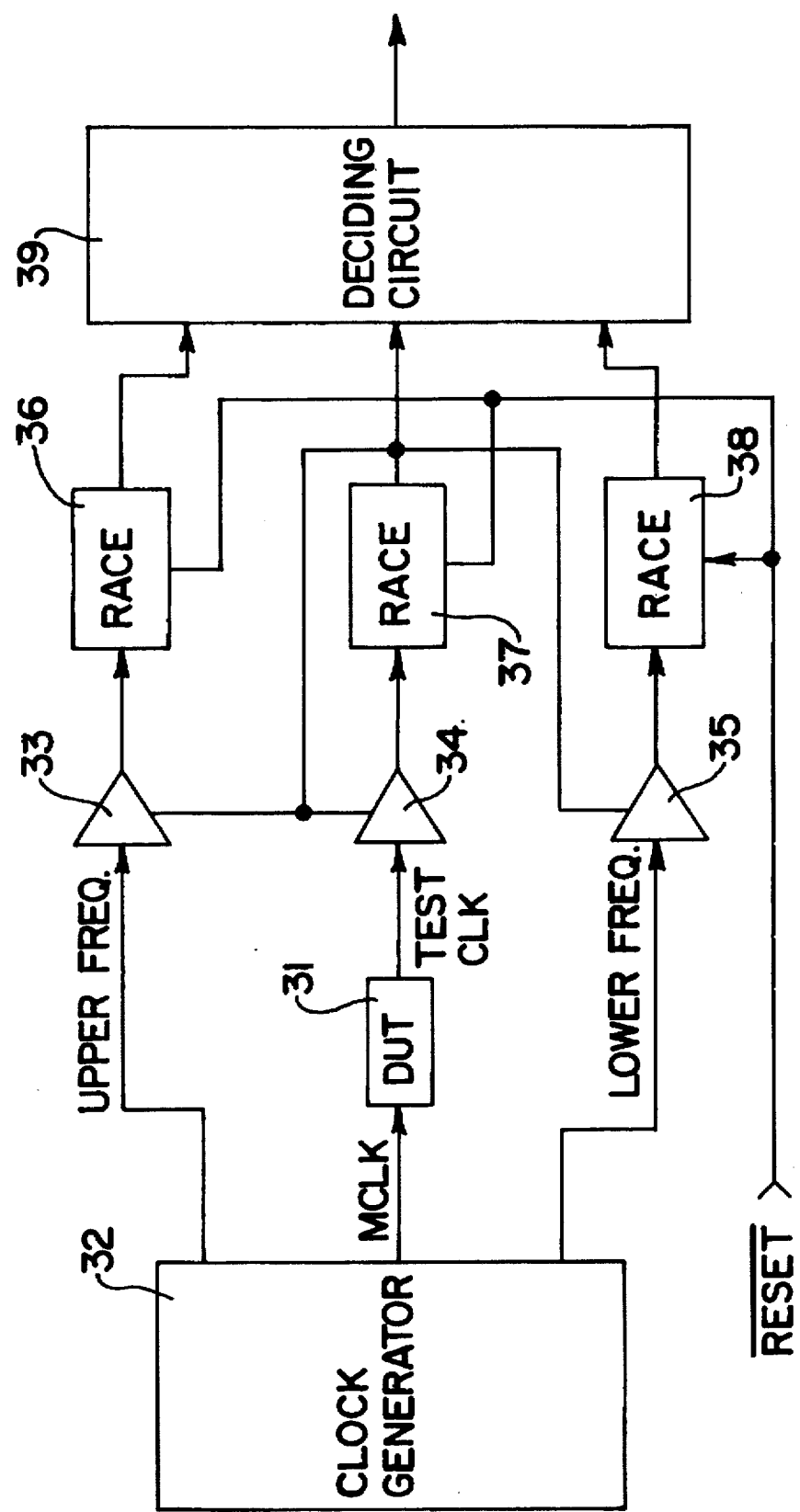
FIG. 3 is a block diagram illustrating the constitution of a frequency testing circuit according to the present invention.

FIG. 3 is a block diagram illustrating the constitution of a frequency testing circuit according to the present invention.

The circuit according to the present invention for checking whether an electronic circuit, or DUT, which may be a circuit for generating clock frequencies generates signals of a regulated frequency range, may include: clock generator 32 for generating upper limit frequency clock signals and lower limit frequency clock signals based on clock signals of DUT 31, and for generating driving clocks/signals MCLK to cause DUT 31 to generate clock signals as designed; first transmitting circuit 33 for transmitting or blocking the upper frequency clock signals of clock generator 32; second transmitting circuit 34 for transmitting or blocking the test clock signals of DUT 31; third transmitting circuit 35 for transmitting or blocking the lower limit frequency clock signals of clock generator 32; first racing circuit 36 connected to first transmitting circuit 33 for counting (or dividing) incoming clocks from the moment when reset signals are enabled, and for varying an output voltage state upon reaching a certain number of clocks; second racing circuit 37 connected to second transmitting circuit 34 for counting (or dividing) incoming clock signals from the moment when reset signals are enabled, and for varying an output voltage state upon reaching a certain number of clock signals, with an output of the second racing circuit being supplied to first, second and third transmitting circuits 33, 34 and 35 as control signals; third racing circuit 38 connected to third transmitting circuit 35 for counting (or dividing) incoming clock signals from the moment when reset signals are enabled, and for varying an output voltage state upon reaching a certain number of clock signals; and deciding circuit 39 with its input connected to output terminals of first, second and third racing circuits 36, 37 and 38 for outputting a pass signal only when first racing circuit 36 first changes, and then second racing circuit 37 changes next.

Transmitting circuits 10, 11 and 12 may be 3-state buffers or other suitable digital switching gates or devices. Racing circuits 36, 37 and 38 may be digital counters, frequency dividers or the like.

Referring to the wave patterns of FIG. 4, a frequency testing circuit according to the present invention will be described based on an example in which electronic circuit DUT 31 as an object to be tested generates clock signals of a pertinent frequency.

In order to check whether electronic circuit DUT 31 generates clock signals of the pertinent frequency, if driving clocks MCLK are supplied to cause DUT 31 to generate testing clock signals as designed, then clocks as illustrated in FIG. 4B are generated. Further, in this case, clock generator 32 generates the upper limit frequency clock signals (FIG. 4A) and the lower limit frequency clock signals (FIG. 4C) as regulated by the clock signals of DUT 31.

When reset signals are supplied to first, second and third racing circuits 36, 37 and 38, then races are started. That is, racing circuits 36, 37 and 38 each count a certain number of pulses, e.g., 1000 pulses, and the one which completes the counting first changes its output.

Racing circuits 36, 37 and 38 generate outputs when the counting (or dividing) of a predetermined number of pulses is finished, and, therefore, it is a matter of fact that the first racing circuit to reach the certain number of pulses generates the output first. The output from second racing circuit 37 is connected to first, second and third transmitting circuits 33, 34 and 35 as control signals, and, therefore, at the moment when second racing circuit 37 generates an output, transmitting circuits 33, 34 and 35 block the transmission of signals. Then, deciding circuit 39, which decides pass or fail based on an analysis of the racing result, generates a pass or fail signal. If the test pulse frequency is lower than the upper limit frequency while also higher than the lower limit frequency, then first race circuit 36 generates an output first, with second race circuit 37 later generating an output, which blocks any further output from third transmitting circuit 35. In such a situation, deciding circuit 39 generates a pass signal.

If the test pulse frequency is higher than the upper limit frequency, the output of second racing circuit 37 is output earlier than that of first racing circuit 36 so as to block all of the transmitting circuits, and, as a result thereof, deciding circuit 39 generates a fail signal. Meanwhile, if the test pulse frequency is lower than that of the lower limit frequency, then the first and third racing circuits generate outputs first, and therefore, deciding circuit 39 generates a failed signal.

Figure 5:
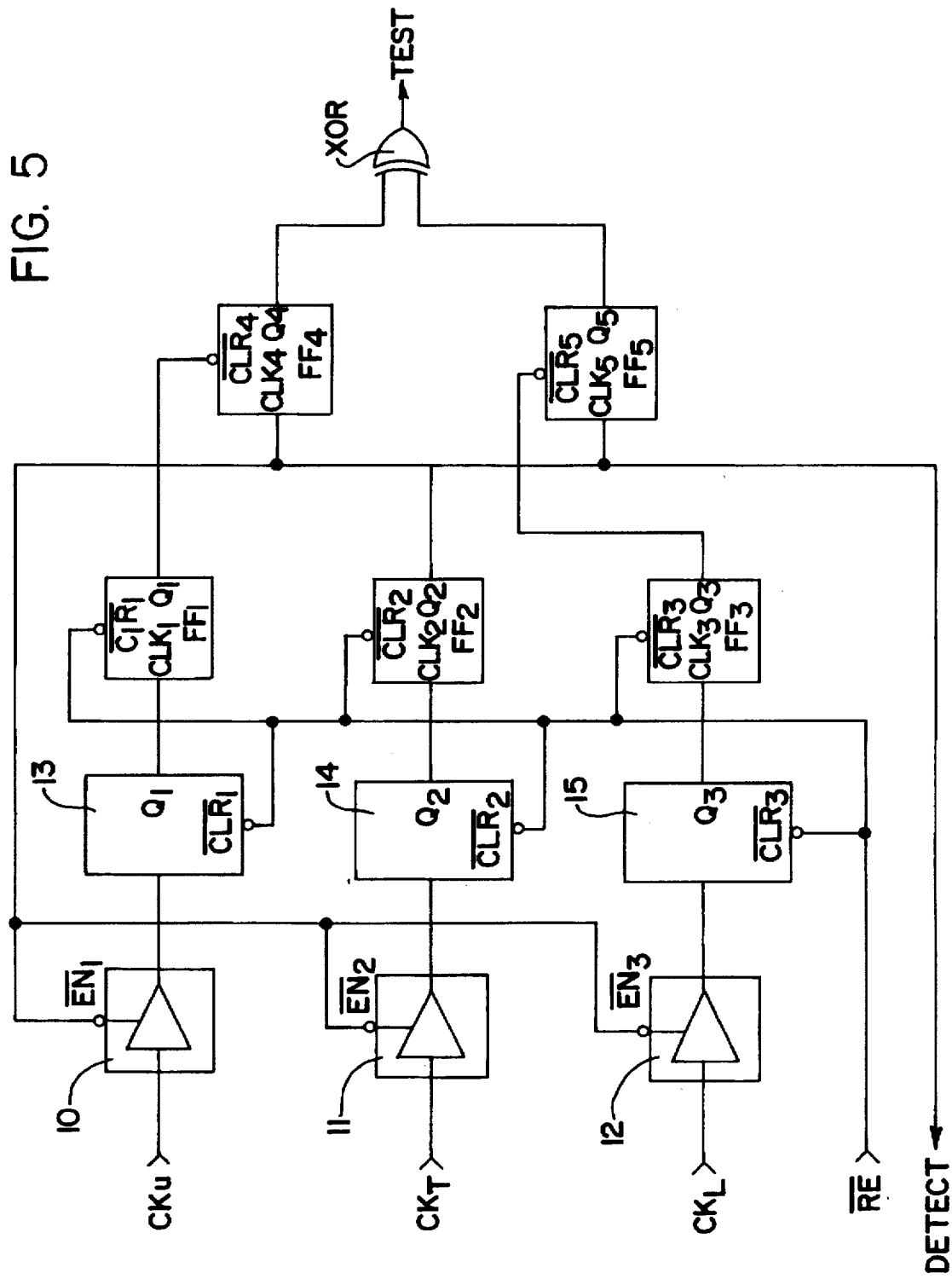
FIG. 5 is a circuit illustration for a frequency testing circuit according to the present invention.

Now an embodiment of the present invention will be further described referring to FIG. 5.

A circuit for testing frequencies according to the present invention as illustrated in FIG. 5 includes: 3-state buffers 10, 11 and 12 for passing upper limit frequency clock signal $CK_U$, test clock signal $CK_T$ and lower limit frequency clock signal $CK_L$ upon being enabled by an output signal of second flip-flop FF2; frequency dividers 13, 14 and 15, which are cleared by external reset signal RE, and which frequency-divide upper limit frequency clock signal $CK_U$, test clock signal $CK_T$ and lower limit frequency clock signal $CK_L$ from 3-state buffers 10, 11 and 12 into a certain ratio; first, second and third flip-flops FF1, FF2 and FF3, which are cleared by external reset signal RE, and which receive output signals of frequency dividers 13, 14 and 15 as clock signals to output corresponding output signals; fourth and fifth flip-flops FF4 and FF5, which are cleared by the output signals of first and third flip-flops FF1 and FF3, and which receive the output signal of second flip-flop FF2 as a clock signals to generate corresponding output signals; and exclusive OR gate XOR for subjecting the output signals of fourth and fifth flip-flops FF4 and FF5 to an exclusive OR operation to output test result signals.

Now the present invention constituted above will be described as to its operation and effect.

As an example, a procedure of checking whether the frequency of test clock signal $CK_T$ is within a range of an upper frequency limit of 5.01 MHz and a lower frequency limit of 4.99 MHz will be described. The frequency divider used in this example is one which is capable of dividing the frequency into 1/1000.

Clock signals of 5.01 MHz (period: 199.6 ns) are supplied to upper limit frequency clock terminal $CK_U$, and clock signals of 4.99 MHz (period: 200.4 ns) are supplied to lower limit frequency clock terminal $CK_L$. At the same time, clock signals to be tested are supplied to the test clock terminal $CK_T$.

First, in the case where test clock signal $CK_T$ is faster than upper limit frequency clock signals $CK_U$, that is, for example, in the case where a 5.5 MHz test clock signal (period: 181.8 ns) exceeding the 5.01 MHz upper frequency limit is input, output terminal Q2 of frequency divider 14 outputs a rising edge signal after 181.8 ns×1000=181,800 ns. Accordingly, output terminal Q2 of flip-flop FF2 outputs a rising edge signal, and these signals are supplied to clock terminals CLK4 and CLK5 of flip-flops FF4 and FF5, respectively.

However, the output terminals Q1 and Q3 of frequency dividers 13 and 15 are still outputting low signals, and, therefore, clock signals are not supplied to clock terminals CLK1 and CLK3 of flip-flops FF1 and FF3. Consequently, low signals are continuously supplied to the clear terminals CLR of flip-flops FF4 and FF5, with the result that low signals are continuously output from output terminals Q4 and Q5 of flip-flops FF4 and FF5.

Further, 3-state buffers 10, 11 and 12 are disabled by the high signals which are output from flip-flop FF2, with the result that no clock signals are further input to the frequency dividers. Consequently, frequency dividers 13, 14 and 15 are maintained in the previous state.

Therefore, low signals are output from output terminals Q4 and Q5 of flip-flops FF4 and FF5, and, consequently, a low signal is output from exclusive OR gate XOR. This fact indicates that test clock signal $CK_T$ is not within the upper limit to the lower limit range.

Second, the case in which the test clock signal $CK_T$ is faster than lower limit frequency clock signal $CK_L$ and slower than upper limit frequency clock signal $CK_u$ (e.g., 5.00 MHz, and 200 ns period) will be described. In this case, output terminal Q1 of frequency divider 13 outputs a rising edge signal first after 199.6 micro seconds (µs). This signal is supplied as clock signal CLK1 of flip-flop FF1, so that output terminal Q1 of flip-flop FF1 outputs a high signal. Then, this signal is supplied as clear signal CLR4 for flip-flop FF4, so that flip-flop FF4 is placed in an operating state.

After 200 micro seconds (µs), a rising edge signal is output from output terminal Q2 of frequency divider 14, and this signal is supplied as clock signal CLK2 for flip-flop FF2. The output signal of flip-flop FF2 is supplied to clock terminal CLK4 of flip-flop FF4 and clock terminal CLK5 of flip-flop FF5, with the result that a high signal is output from output terminal Q4 of flip-flop FF4 and a low signal is output from output terminal Q5 of flip-flop FF5.

However, owing to the high signal from flip-flop FF2, 3-state buffers 10, 11 and 12 are disabled, so that frequency dividers 13, 14 and 15 do not operate to transmit clocks any longer, but would be maintained in the previous state.

Consequently, owing to the high signal from flip-flop FF4 and the low signal from flip-flop FF5, a high signal is output from exclusive OR gate XOR. This fact indicates that the test clock signal $CK_T$ lies between the upper limit and the lower limit frequencies.

Third, the case in which test clock signal $CK_T$ is slower than the lower limit frequency clock signal $CK_L$, e.g., 4.5 MHz (period: 222.2 ns), will be described. In this case, output terminal Q1 of frequency divider 13 first outputs a rising edge signal after 199.6 micro seconds (µs). This signal is supplied as clock signal CLK1 of flip-flop FF1, with the result that output terminal Q1 of flip-flop FF1 outputs a high signal. This high signal is supplied as clear signal CLR4 for flip-flop FF4, so that flip-flop FF4 is placed in an operating state.

After 200.4 micro seconds (µs), a rising edge signal is output from output terminal Q3 of frequency divider 15, and this signal is supplied as clock signal CLK3 of flip-flop FF3, with the result that output terminal Q3 of flip-flop FF3 outputs a high signal. This high signal is supplied as clear signal CLR5 for flip-flop FF5, so that flip-flop FF5 is placed in an operating state.

Finally after 222.2 micro seconds (µs), a rising edge signal is output from output terminal Q2 of frequency divider 14, and this signal is supplied as clock signal CLK2 of flip-flop FF2, with the result that output terminal Q2 of flip-flop FF2 outputs a high signal. This high signal is supplied as clock signals CLK4 and CLK5 for flip-flops FF4 and FF5, with the result that the output terminals Q4 and Q5 of flip-flops FF4 and FF5 output high signals.

Further, due to the high signal from flip-flop FF2, 3-state buffers 10, 11 and 12 are all disabled, and frequency dividers 13, 14 and 15 are not operating any further, but instead are maintained in the previous state.

As a result, with the high signals from flip-flops FF4 and FF5, a low signal is output from exclusive OR gate XOR, and this fact indicates that test clock signal $CK_T$ does not lie between the upper limit and the lower limit frequencies.

According to the present invention as described above, it can be confirmed as to whether rectangular clock signals are generated within a particular frequency range with a simple circuit consisting of frequency dividers and flip-flops, without requiring high resolution/frequency timing generators, pattern generators or clock generators. Therefore, high frequency rectangular clock signals can be accurately tested at a lower cost.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. An apparatus for testing whether the frequency of a clock signal of alternating high and low pulses generated by a circuit is within a predetermined frequency range, comprising:

a clock generator generating an upper limit frequency clock signal of alternating high and low pulses and a lower limit frequency clock signal of alternating high and low pulses;

a first transmitting circuit selectively transmitting the upper limit frequency clock signal of the clock generator;

a second transmitting circuit selectively transmitting the clock signal of the circuit;

a third transmitting circuit selectively transmitting the lower limit frequency clock signal of the clock generator;

a first racing circuit coupled to the first transmitting circuit for dividing the upper limit frequency clock signal, wherein the first racing circuit generates an output signal in response to a predetermined number of pulses of the upper limit frequency clock signal;

a second racing circuit coupled to the second transmitting circuit for dividing the clock signal of the circuit, wherein the second racing circuit generates an output signal in response to a predetermined number of pulses of the clock signal of the circuit;

a third racing circuit coupled to the third transmitting circuit for dividing the lower limit frequency clock signal, wherein the third racing circuit generates an output signal in response to a predetermined number of pulses of the lower limit frequency clock signal; and a decision circuit coupled to receive the output signals of the first, second and third racing circuits, wherein the decision circuit outputs a pass signal in response to receiving the output signal of the first racing circuit prior to receiving the output signal of the second racing circuit.

2. The apparatus of claim 1, wherein the decision circuit generates a fail signal in response to receiving the output signal of the second racing circuit before receiving the output signal of the first racing circuit.

3. The apparatus of claim 1, wherein the decision circuit generates a fail signal in response to receiving the output signal of the third racing circuit before receiving the output signal of the second racing circuit.

4. The apparatus of claim 1, wherein the decision circuit generates a pass signal if the output signal of the first racing circuit is received prior to the output signal of the second racing circuit and the output signal of the second racing circuit is received prior to receiving the output signal of the third racing circuit.

5. The apparatus of claim 1, wherein the circuit generates the clock signal in response to a signal from the clock generator.

6. The apparatus of claim 1, wherein the output signal of the second racing circuit is coupled to a control input of the first, second and third transmitting circuits, wherein the first, second and third transmitting circuits do not transmit clock signals in response to the output signal of the second racing circuit.

7. The apparatus of claim 6, wherein, if the output signal of the second racing circuit is received by the decision circuit prior to receiving the output signal of the first racing circuit, then the output signal of the first racing circuit is not generated and the decision circuit outputs a fail signal.

8. The apparatus of claim 7, wherein, if the output signal of the first racing circuit is received prior to the output signal from the second racing circuit, and if the output signal of the second racing circuit is received prior to the output signal of the third racing circuit, then the output signal of the third racing circuit is not generated and the decision circuit outputs a pass signal.

9. The apparatus of claim 8, wherein, if the output signal of the third racing circuit is received prior to the output signal of the second racing circuit, then the decision circuit outputs a fail signal.

10. The apparatus of claim 1, wherein the first, second and third transmitting circuits comprise 3-state buffers.

11. The apparatus of claim 1, wherein the first, second and third racing circuits each comprise a frequency divider coupled to a flip-flop.

12. The apparatus of claim 1, wherein the first, second and third racing circuits each comprise a counter coupled to a flip-flop.

13. The apparatus of claim 1, wherein the decision circuit comprises:

a first flip-flop receiving the output signal of the first racing circuit through a clear input terminal of the first flip-flop, and receiving the output signal of the second racing circuit through a clock input terminal of the first flip-flop;

a second flip-flop receiving the output signal of the third racing circuit through a clear input terminal of the second flip-flop, and receiving the output signal of the second racing circuit through a clock input terminal of the second flip-flop; and an exclusive OR circuit receiving an output signal of the first flip-flop and an output signal of the second flip-flop as inputs to the exclusive OR circuit, wherein the pass or fail signal is generated at an output of the exclusive OR circuit.

14. A method for determining whether the frequency of a clock signal of alternating high and low pulses generated by a circuit is within a frequency range, comprising the steps of:

generating an upper limit frequency clock signal of alternating high and low pulses and a lower limit frequency clock signal of alternating high and low pulses;

dividing the pulses of the clock signal of the circuit, the upper limit frequency clock signal and the lower limit frequency clock signal and generating output signals based upon predetermined numbers of pulses; and generating a pass signal in response to an output signal generated based upon the dividing of pulses of the upper limit frequency clock prior to generation of an output signal based upon the dividing of pulses of the clock signal of the circuit.

15. The method of claim 14, further comprising the step of generating a fail signal in response to an output signal generated based upon the dividing of pulses of the clock signal of the circuit prior to generation of an output signal based upon the dividing of pulses of the upper limit frequency clock.

16. The method of claim 14, further comprising the step of generating a fail signal in response to an output signal generated based upon the dividing of pulses of the lower limit frequency clock prior to generation of an output signal based upon the dividing of pulses of the clock signal of the circuit.

17. The method of claim 14, wherein a pass signal is generated in response to an output signal generated based upon the dividing of pulses of the upper limit frequency clock prior to generation of an output signal based upon the dividing of pulses of the clock signal of the circuit, and also in response to generating an output signal based upon the dividing of pulses of the clock signal of the circuit prior to generation of an output signal based upon the dividing of pulses of the lower limit frequency clock.

18. The method of claim 14, wherein, in response to an output signal generated based upon the dividing of pulses of the clock signal of the circuit, the generation of output signals based upon the dividing of pulses of the upper limit frequency clock and the lower limit frequency clock are inhibited.

19. The method of claim 14, wherein the step of dividing the pulses is conducted by coupling the clock signal of the circuit, the upper limit frequency clock signal and the lower limit frequency clock signal to frequency dividers coupled to flip-flops.

20. The method of claim 14, wherein the step of dividing the pulses is conducted by coupling the clock signal of the circuit, the upper limit frequency clock signal and the lower limit frequency clock signal to counters coupled to flip-flops.

* * * * *